United States Patent [19]
Rösler

[11] 4,291,240
[45] Sep. 22, 1981

[54] TWO OUTPUT CLOCK FOR INTEGRATED SEMICONDUCTOR DIGITAL CIRCUITS

[75] Inventor: Helmut Rösler, Munich, Fed. Rep. of Germany

[73] Assignee: Siemens Aktiengesellschaft, Berlin & Munich, Fed. Rep. of Germany

[21] Appl. No.: 62,678

[22] Filed: Aug. 1, 1979

[30] Foreign Application Priority Data

Aug. 30, 1978 [DE] Fed. Rep. of Germany ....... 2837882

[51] Int. Cl.³ .............................................. H03K 5/00
[52] U.S. Cl. .................................... 307/262; 307/269; 328/62
[58] Field of Search ................... 307/262, 269; 328/62

[56] References Cited

U.S. PATENT DOCUMENTS 3,225,301 12/1965 McCann ............................. 307/269
3,471,790 10/1969 Kaps .................................... 307/269
3,624,518 11/1971 Dildy .................................. 307/269

FOREIGN PATENT DOCUMENTS 2015129 10/1970 Fed. Rep. of Germany.
2345837 3/1975 Fed. Rep. of Germany.

Primary Examiner—Harold A. Dixon
Attorney, Agent, or Firm—Hill, Van Santen, Steadman, Chiara & Simpson

[57] ABSTRACT

A pulse converter for transforming periodic signals of any waveform into two output series of digital pulses such that the duty cycle of one of the series is temporarily separated from the duty cycle of the other series by non-duty cycle intervals to avoid interfering overlapping of the pulse series when employed in additional digital circuitry as clock pulses. The pulse converter can be attached to any periodic signal input, or may be provided with an input network to produce the pulse series from standard alternating current.

8 Claims, 3 Drawing Figures

TWO OUTPUT CLOCK FOR INTEGRATED SEMICONDUCTOR DIGITAL CIRCUITS

BACKGROUND OF THE INVENTION

1. Field of the Invention

The present invention relates to a clock for use with integrated semiconductor digital circuits and in particular such a clock having two signal outputs at which different digital pulses having the same period appear.

2. Description of the Prior Art and Other Related Documents

A clock for use with integrated semiconductor digital circuits which produces two series of periodic digital pulses which are phase-shifted with respect to each other by the same time value is disclosed in German OS 23 45 837. Other circuits for producing two phase-shifted output pulse trains are disclosed in German OS 20 15 129.

In the German patent application P 27 13 319.3, filed on Mar. 25, 1977 and published on Sept. 28, 1978, an electronic clock for digital installations is disclosed having a pulse generator which produces periodic digital pulses and a pulse converter which operates on the pulses to produce two separate digital outputs. The two digital pulse outputs have a defined temporal relation such that the duty cycle of one of the pulse trains is separated from the duty cycle of the other by non-duty cycle intervals. The presence of the non-duty cycle intervals between the duty cycles of the two pulse series substantially minimizes interfering overlapping of the duty cycles in the digital circuitry which is to be controlled by the clock. Such overlapping otherwise occurs quite readily because of transit time differences.

SUMMARY OF THE INVENTION

Digital clock circuits may be designed so as to fall into the category of a pulse generator by which is meant that the clock itself produces an initial pulse series which may be subsequently operated on by additional circuitry to produce further pulse outputs of desired frequency and shape. Digital clocks may also be designed as pulse converters or transformers, in which a control pulse is entered into a clock input and the clock circuitry operates on the input pulse to produce the desired series of output clock pulses.

When digital clocks of the latter type are utilized it is frequently the case that control pulses are available only from a pulse source of low frequency, such as standard two phase alternating current. Conventional clock circuits which operate to convert such a low frequency input can not produce output pulse trains of a sufficiently high frequency to operate many digital circuits, and in particular can not be utilized as a clock pulse source for circuitry including quasi-stationary shift register cells.

It is therefore an object of the present invention to provide clock pulse circuitry which can operate on input pulses of any frequency, and in particular, standard alternating current, to produce two clock pulse series at its outputs having the same frequency and period but having differing duty cycles such that when aligned the respective duty cycles are separated by non-duty cycle intervals, and are of a frequency sufficiently high enough to control circuitry including quasi-stationary shift registers. The circuit may have an input terminal for connection with any external pulse source, or may include a network for the input of signals from standard alternating current.

The input or control signal is connected through an input resistor which forms part of an input circuit which also includes a three pole switch and an inverter, and has inverted and non-inverted outputs. The outputs of the input circuit are connected to a first flip-flop cell of the reset type having two signal outputs which are respectively connected to identically dimensioned delay lines which serve as inputs to a second flip-flop cell. The outputs of the second flip-flop are cross connected to respective ones of a pair of two input logic gates, each gate having its other input received from the respective outputs of the first flip-flop cell.

One of the outputs of the second flip-flop cell also serves as an input to a third flip-flop cell which has as its other input the control input signal, admitted thereto through an inverter. An output of the third flip-flop cell is connected to the three pole switch for controlling the charging state in the input level circuit by operating as a charge or pulse killer.

The dual pulse trains serving as clock pulse series are taken from the outputs of the pair of logic gates.

The pulse converter can also be provided with an input network for directly adapting the converter to receive an input in the form of standard alternating current such as 50 Hz current in Europe or 60 Hz current in North America. The circuit disclosed herein may be realized utilizing either bipolar technology or MOS technology.

DESCRIPTION OF THE PREFERRED EMBODIMENTS

Figure 1:
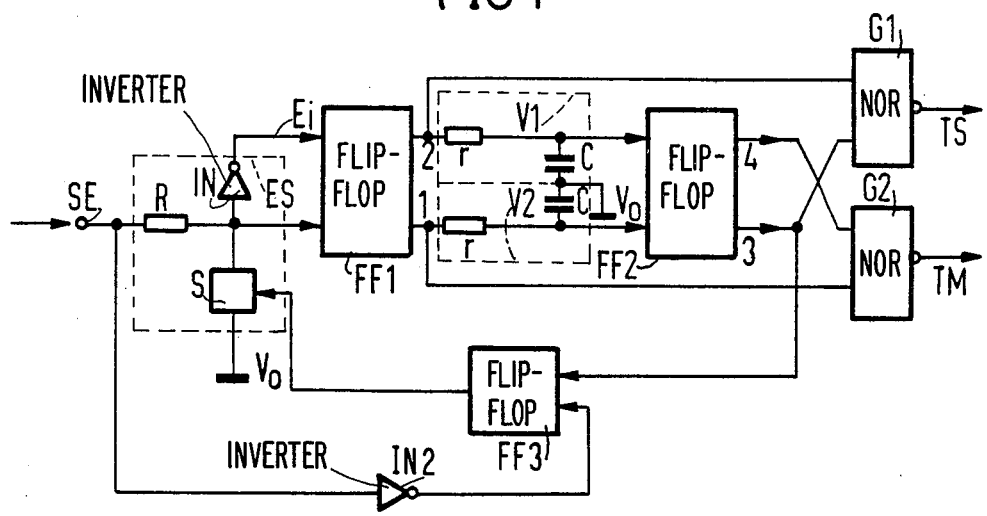
FIG. 1 illustrates a schematic diagram of a two output pulse converter constructed in accordance with the principles of the present invention.

A clock pulse converter circuit for providing two clock pulse supplies of the same frequency from a single input, which may be of low frequency such as standard alternating current, is shown in FIG. 1. The circuit has an input terminal SE which may be connected to an independent external pulse source or to a coupling network, shown in greater detail in FIG. 2, for direct operation from a standard low frequency current source.

The input terminal SE is connected to an input level circuit ES at an input resistor R. The input level circuit ES also has a three-pole electronic switch S whose operation is described in greater detail below. The switch S has a controlled input connected to an output of a flip-flop cell FF3, and a terminal connected to a reference potential $V_0$. The output of the switch S is directly connected to one input of a first flip-flop cell FF1 and connected through an inverter IN to an inverted input $E_i$ of the cell FF1. These outputs may also be referred to as the non-inverted and inverted outputs of the input level circuit ES.

The cell FF1 has outputs 1 and 2 which are connected to respective delay lines V2 and V1. Each delay line is identically dimensioned and consists of a resistor r and a capacitor C. The two capacitors C are connected with a path to the reference potential $V_0$ between the capacitors.

The respective outputs of the delay lines V2 and V1 serve as the inputs to a second flip-flop cell FF2 which has outputs 3 and 4. The output 3 of the cell FF2 serves as one input to a logic gate G1 which has the output 2 of the flip-flop cell FF1 as its other input. Similarly, the output 4 of the flip-flop cell FF2 serves as one input to a second logic gate G2, which has as its other input the output 1 of the first flip-flop cell FF1.

Figure 2:
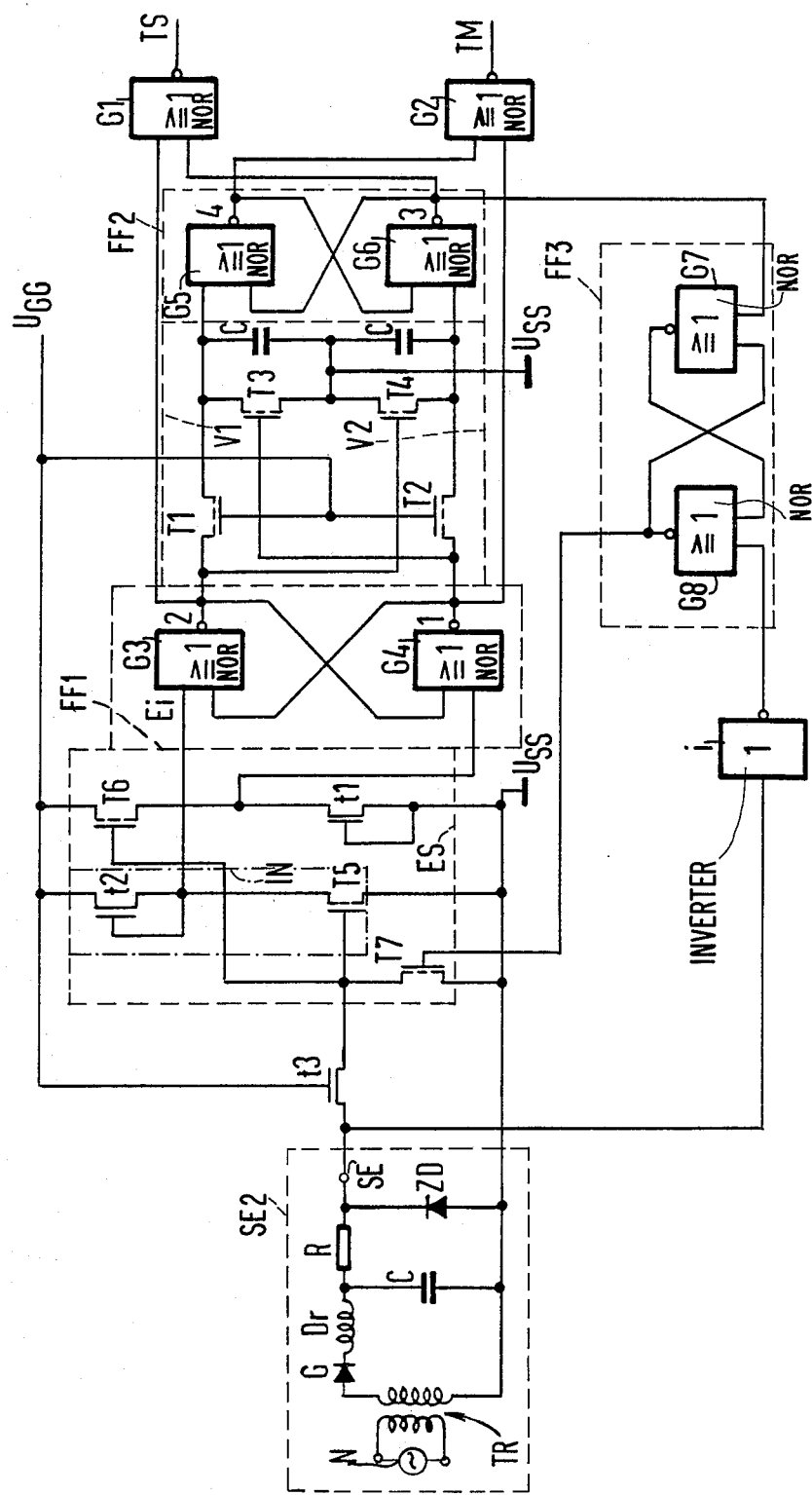
FIG. 2 is a more detailed illustration of the circuit of FIG. 1 realized in MOS technology and including an input network for coupling to a standard alternating current source.

The logic gates G1 and G2 in the embodiment of FIGS. 1 and 2 are shown as NOR gates, however, it will be understood that NAND gates could also be utilized. All flip-flop cells are of the reset type. The operative relationship between the outputs of the flip-flop cells and the logic gates G1 and G2 is that the gates G1 and G2 be connected to the cells FF1 and FF2 such that in the absence of the two delay lines V1 and V2, each of the gates G1 and G2 would be synchronized at the same logic level. By this is meant that at any given point in time the inputs to one of the gates G1 or G2 would be both a logical 1, while the inputs at the same time to the other logic gate would be a logical zero. In the absence of the delay lines V1 and V2, the levels would then be transposed, so that the gate which previously had two logical 1 inputs would then have two logical zero inputs, while the gate which previously had two logical zero inputs would then have two logical 1 inputs.

A third flip-flop cell FF3 serves to control the three-pole switch S. The cell FF3 has one input which is the output of the second flip-flop cell FF2 which, in the absence of the delay lines V1 and V2 would be synchronized with the input $E_i$ of the first flip-flop cell FF1 and display the same logic state. In the embodiment shown in FIG. 1 this is the output 3 of the second flip-flop cell FF2. The other input to the cell FF3 is the control input signal from the input SE transmitted to the cell FF3 through an inverter IN2.

Operation of the switch S as controlled by the output of the third flip-flop cell FF3 is such as to determine the branching point of the input signal in order to bring about the disappearance of the charge collecting in each pulse phase. As shown in greater detail in connection with the operation of the circuit of FIG. 2, the switch S is preferably a transistor, connected to operate as a charge or pulse killer.

Figure 3:
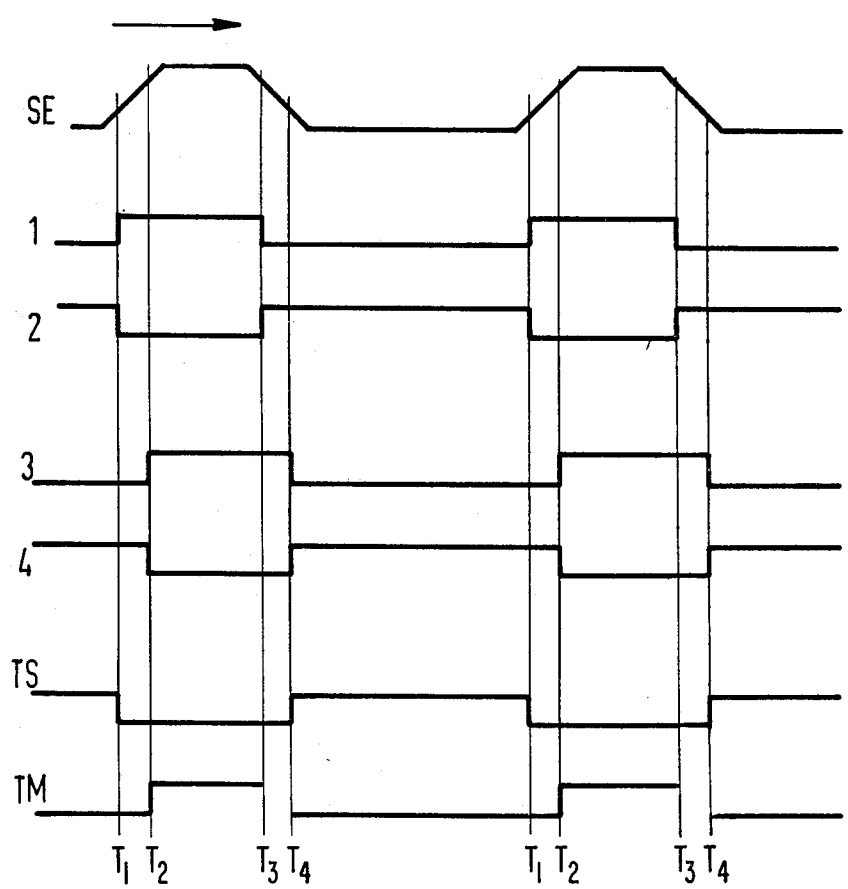
FIG. 3 is a graphic representation of signals appearing at various points in the circuits of FIGS. 1 and 2.

Operation of the circuit of FIG. 1 is described with reference to the graphic signal representations shown in FIG. 3. Although the input signal SE shown in FIG. 3 exhibits trapezoidal waveforms, it will be understood that the input signal need not be restricted to this type of waveform and the circuits of FIGS. 1 and 2 can accommodate waveforms of any shape, by use of an appropriate network as shown in FIG. 2. The operation of the input level circuit ES on the input signal SE results in inverted and non-inverted rectangular pulse series which are supplied to the first flip-flop cell FF1. The outputs 1 and 2 of the first flip-flop cell FF1 are shown in FIG. 3. The operation of the delay lines V2 and V1 on the respective pulse series 2 and 1 result in the outputs 3 and 4 shown in FIG. 3 from the second flip-flop cell FF2. It will be understood that any desired delay can be achieved by appropriate dimensioning of the delay lines V1 and V2. In particular, the delay is dimensioned such that the beginnings of the respective duty cycles of the outputs 3 and 4 occur only as long as the same levels are maintained at the respective outputs 1 and 2 of the first flip-flop cell FF1. Thus, as shown in FIG. 3, the point $T_2$, representing the beginning of the duty cycle of the pulse trains 3 and 4, must occur in a temporal position between the points $T_1$ and $T_3$. The termination of the duty cycle of the pulses 3 and 4 is shown at point $T_4$.

The two delay lines V1 and V2 are constructed as RC lines having a cross capacitor C placed at the reference potential $V_0$ and a resistor r so that the delay lines V1 and V2 can exhibit delay times as equal as possible.

The circuit output pulse trains from the gates G1 and G2 are respectively shown as TS and TM in FIG. 3. The pulse signal TM which appears at the output of the gate G2 corresponds to the pulses which appear at the output 3 of the second flip-flop cell FF2. The pulse series TS which appears at the output of the gate G1 has a duty cycle with a beginning which is synchronized with the duty cycles of the signals 1 and 2 from the first flip-flop cell FF1, however, the duty cycle of TS ends synchronized with the end of the duty cycles of the pulse series which are the outputs 3 and 4 of the second flip-flop cell FF2.

The control of the third flip-flop cell FF3 is required to suitably operate the three-pole switch S. The switch S is employed to unload the input level circuit ES once during each cycle of the control input pulse SE in order to attain exact alignment and synchronization of the pulse edges as shown in FIG. 3. To achieve this result, during each cycle of the input control pulse SE, the input level from the input level circuit ES (represented by the inverted and non-inverted outputs) must be cleared of all accumulated charge before the appearance of the next successive control pulse. The switch S thus serves as a charge killer which is controlled by one output of the third flip-flop cell FF3 which activates the killing effect of the switch S by connecting only the output of the cell FF3 thereto which is temporally the second output to reach a logical 1 state.

The realization of the circuit of FIG. 1 in MOS technology is shown in FIG. 2.

The circuit represented in FIG. 2 includes, in addition to the actual circuit shown in FIG. 1, an additional circuit network SE 2 which provides a coupling of the remainder of the circuit of FIG. 2 to a public current source represented at N.

The network SE 2 includes a transformer TR connected to a rectifier G and a inductor Dr which serves to suppress interfering harmonic waves through a filter capacitor $C_n$ and a filter resistor $R_n$. The primary side of the transformer TR will lie at ground, and a suitable reference potential $U_{SS}$ can be chosen to match the primary ground. A Zener diode ZD is connected in parallel across the secondary coil of the transformer TR to cut off the peaks of the half wave admitted by the rectifier G.

The pulses which thus appear at the input SE are of the trapezoidal shape shown in FIG. 3 however, by appropriate dimensioning of the Zener diode ZD and of the filter resistor R and the filter capacitor C, a triangular-shaped waveform can be achieved.

The input network SE 2 may be manufactured on a separate integrated chip which may then be combined with a chip containing the remainder of the circuit shown in FIG. 2, with a common ground connection.

In the circuit of FIG. 2, a MOS field effect transistor t3 operating in the depletion mode corresponds to the input resistor R of the circuit of FIG. 1. The inverter IN in the embodiment shown in FIG. 2 is comprised of a field effect transistor T5 operating in the enhancement mode having a source connected to the reference potential $U_{SS}$ and having its drain connected directly to the input $E_i$ of the first flip-flop cell FF1 and also connected to a transistor t2 operating in the depletion mode which is connected to the operating potential $U_{GG}$. The gate of the transistor t3 is also connected to the operating potential $U_{GG}$, so that the transistor t3 and t2 exhibit resistive impedances.

A transistor T7 serves the function of the switch S and has its drain connected to one output of the third flip-flop cell FF3 for operation as a charge or pulse killer.

Besides the transistor T7 and the inverter IN, the input level circuit ES includes a source-follower circuit consisting of a series connected transistor T6 operating in the enhancement mode and a transistor t1 operating in the depletion mode as a resistor. In contrast to the inverter IN, the transistor t1 which operates as a resistor lies at the reference potential $U_{SS}$ and the enhancement mode transistor T6, the gate of which is connected through the transistor t3 to the control input SE, has its drain connected to the supply potential $U_{GG}$. The signal output of the source-follower circuit is a circuit point between the two transistors T6 and t1.

The first flip-flop cell FF1 is formed by two cross connected NOR gates G3 and G4 such that the free input of the NOR gate G4 is connected to the output of the source-follower circuit and the input $E_i$ of the gate G3 is connected to the output of the inverter IN. The output pulses appearing at the outputs 1 and 2 of the first flip-flop cell FF1 are shown in FIG. 3.

The output 2 of the NOR gate G3 is connected directly to one of the two logical inputs of the NOR gate G1 which has the output TS, and is also connected through a delay line V1 to one input of the NOR gate G5 which forms one component of the second flip-flop cell FF2. Similarly, the output 3 of the NOR gate G4 is connected to one input of the NOR gate G2 which has the output TM and also is connected through a delay line V2 to one input of the NOR gate G6 which forms the other component of the second flip-flop cell FF2. The signal outputs 3 and 4 of the cell FF2 are shown in FIG. 3.

The two delay lines V1 and V2 are equivalent to each other and consist of MOS transistors and MOS capacitors. As shown in FIG. 2, the output 2 of the NOR gate G3 is connected to the gate of a MOS transistor T4 operating in the enhancement mode, and is also connected to the drain of a MOS transistor T1 which also operates in the enhancement mode and forms the resistive impedance for the delay line V1. Similarly, the output 1 of the NOR gate G4 is connected to the gate of a MOS transistor T3 operating in the enhancement mode and is also connected to the drain of a MOS transistor T2, also operating in the enhancement mode, which provides the resistive impedance for the delay line V2.

The source electrodes of the two transistors T3 and T4 which are gate-controlled by the respective outputs of G3 and G4 are connected to the reference potential $U_{SS}$, whereas the respective drains of those transistors are connected to the respective outputs of G4 and G3. The two transistors T3 and T4 are bridged by means of two capacitors $C_d$. The gates of the two MOS field effect transistors T1 and T2, which represent the resistances of the two delay lines V1 and V2, are circuited together at the same operating potential $U_{GG}$. The transistors T3 and T4 serve to discharge the capacitors $C_d$ which are controlled by the outputs of the first flip-flop cell FF1.

The third flip-flop cell FF3 is formed by two cross connected NOR gates G7 and G8. The gate G7 has one input from the output 3 of gate G6 and the other input which is the output of the gate G8. The gate G8 has one input which is the output of the gate G7 and the other input which is the output of the network SE 2 admitted through an inverter i. The output of the gate G8 is also connected to the gate of the transistor T7 used as a charge killer.

The portion of the circuit of FIG. 2 which forms the actual pulse converter can be manufactured without difficulty by means of an integrated circuit on a silicon chip. Uniform doping for the source and drain of the field effect transistors can thus be chosen to simplify manufacture. In addition, the logical gates G1 through G8 may also for example, be NAND gates. If the realization of FIG. 2 is accomplished utilizing NOR gates, however, the gates may be constructed as is known in the art by two field effect transistors connected in parallel, the gates of which form the signal inputs of the NOR gate. The two field effect transistors have their source regions at the reference potential $U_{SS}$ and have their drain regions connected to a common resistor leading to the operating potential $U_{GG}$ with the signal output of the NOR gate taken between the resistor and the two drains of the transistors. If NAND gates are utilized, the two field effect transistors are connected in series to a resistor leading to the operating potential $U_{GG}$ with the source of one of the transistors connected to the reference potential and the drain of the other transistor serving as the signal output and connected to a resistor also leading to the operating potential $U_{GG}$.

In the embodiment of FIG. 2 wherein pulses derived from a standard alternating current source are utilized, the change of state of the first flip-flop cell FF1 first occurs, and the second flip-flop cell FF2 changes state only after the expiration of the delay time prescribed by V1 and V2. When the second flip-flop cell FF2 changes state, the first cell FF1 and the input level circuit ES are returned again to the initial state as a result of the killer effect by the switch S in the embodiment of FIG. 1, or by the transistor T7 in the embodiment of FIG. 2.

Although modifications and changes may be suggested by those skilled in the art, it is the intention of the inventors to embody within the patent warranted hereon all changes and modifications as reasonably and properly come within the scope of their contribution to the art.

I claim as my invention:

1. A clock pulse converter for use with integrated semiconductor digital circuits, said converter having an input connected to a periodic signal supply and having two signal outputs at which different digital pulses having the same period appear, said converter comprised of:

an input level circuit having an input resistor connected to said signal supply and having controlled inverted and non-inverted signal outputs;
   a first flip-flop cell having two inputs connected to respective ones of said input level circuit outputs and having first and second signal outputs;
   two equivalent delay lines each having an input connected to a respective one of said first flip-flop cell outputs, and each having an output;

a second flip-flop cell having two signal inputs each connected to a respective one of said delay line outputs, said second flip-flop cell having a first signal output which in the absence of a delay between the signal inputs of the first flip-flop cell and the signal outputs of the second flip-flop cell would be synchronized with and have the same logical state as the inverted signal input to the first flip-flop cell, said second flip-flop cell also having a second output having the opposite logical state;

a third flip-flop cell having two signal inputs, one of which is connected to said first signal output of said second flip-flop cell and the other of which is connected through an inverter to said signal supply, said third flip-flop cell having two available outputs, only one of which is connected to said input level circuit for controlling the output thereof, said connected third flip-flop cell output changing to a controlling logical state in sequence after the other available output reaches said state;

a first output logic gate having two signal inputs, one of which is connected to said first output of said second flip-flop cell, and the other of which is connected to the output of said first flip-flop cell which, in the absence of the delay lines would be synchronized with and display the same logic level as the first output of said second flip-flop cell, said output logic gate having an output forming one converter output; and a second logic output gate having two signal inputs, one of which is connected to the second signal output of the second flip-flop cell, and the other of which is connected to the output of said first flip-flop cell not connected to the first logic output gate, said second logic output gate having an output forming one of the converter outputs.

2. The converter of claim 1 wherein the first and second logic output gates are NOR gates and wherein each of the delay lines is connected to a reference potential.

3. The converter of claim 1 wherein the input level circuit contains a three-pole electronic switch having a control electrode connected to the output of the third flip-flop cell and having a first electrode connected to the inputs of said first flip-flop cell and a second electrode connected to a reference potential.

4. The converter of claim 3 wherein the resistor in the input level circuit consists of a first MOS field effect transistor having a constant gate potential supplied by a connection to an operating potential, said first field effect transistor having its source connected to said input signals supply and having its drain connected to said first electrode of said switch and wherein said input level circuit further includes an inverter having an input connected to said first electrode of said switch and having an output connected to one input of the first flip-flop cell, and a source-follower circuit comprised of a second field effect transistor having a gate connected to said first electrode of said switch and having a drain connected to said operating potential and a source connected to a third field effect transistor having a gate shorted to the source region, both of which are connected to the reference potential, and an output tap between the source of the second transistor and the drain of the third transistor serving as the non-inverted output of the input level circuit and connected to the first flip-flop cell.

5. The converter of claim 4 wherein the inverter is comprised of fourth and fifth field effect transistors, the fourth field effect transistor having its gate connected to said first electrode of said switch and its source connected to the reference potential, and the fifth transistor having its drain connected to said operating potential and its gate shorted to its source and the source of the fifth transistor connected to the drain of the fourth transistor with an output tap between said connected source and drain serving as said inverted output of said input level circuit and connected to said first flip-flop cell.

6. The converter of claim 1 including a seventh field effect transistor having its drain connected to the first output of said first flip-flop cell and an eighth field effect transistor having its drain connected to the second output of said first flip-flop cell, said seventh and eighth transistors having their gates connected to said operating potential and further including a ninth field effect transistor having its drain connected to the source of said seventh field effect transistor and a tenth field effect transistor having its drain connected to the source of said eighth field effect transistor, said ninth transistor having its gate connected to said second output of said first flip-flop cell and said tenth transistor having its gate connected to the first output of said first flip-flop cell, said ninth and tenth transistors each having a source connected to the reference potential, and further including a capacitor connected in parallel across the drain and source of said ninth transistor and an identical capacitor connected across the drain and the source of the tenth transistor, said seventh and ninth transistors and one capacitor comprising one of said delay lines with said drain of said ninth transistor forming the output thereof, and said eighth and tenth transistors and one of said capacitor forming the other delay line with the drain of said tenth transistor forming the output thereof.

7. The converter of claim 3 wherein said electronic switch is a field effect transistor with its gate serving as the control electrode, its source serving as the second electrode and its drain serving as the first electrode.

8. The converter of claim 1 wherein said periodic signal supply consists of a standard alternating current source connected by a network to said converter input, said network comprising:

a transformer having a primary coil connected to said alternating current source and a secondary coil having a first terminal connected to a reference potential, and a second terminal;

a rectifier, an inductor, and a network capacitor connected in series across said first and second terminals of said secondary coil;

a network resistor and a Zener diode connected in series across said network capacitor; and a network output taken at a point between said network resistor and said Zener diode.

* * * * *